(12) United States Patent
Imai

(10) Patent No.: US 7,247,872 B2
(45) Date of Patent: Jul. 24, 2007

(54) IMAGE RECORDING MEDIUM AND METHOD OF PRODUCING THE SAME

(75) Inventor: Shinji Imai, Kaisei-machi (JP)

(73) Assignee: Fujifilm Corporation, Tokyo (JP)

(*) Notice: Subject to any disclaimer, the term of this patent is extended or adjusted under 35 U.S.C. 154(b) by 97 days.

(21) Appl. No.: 10/387,549

(22) Filed: Mar. 14, 2003

(65) Prior Publication Data

US 2003/0173531 A1    Sep. 18, 2003

(30) Foreign Application Priority Data

Mar. 15, 2002    (JP)    ............... 2002-072249

(51) Int. Cl.
*G01T 1/16*    (2006.01)
(52) U.S. Cl. .................................... 250/580
(58) Field of Classification Search ................ 250/580
See application file for complete search history.

(56) References Cited

U.S. PATENT DOCUMENTS 3,880,795 A  *  4/1975  Haupt et al. ............... 524/611
4,535,468 A      8/1985  Kempter
5,258,203 A  *  11/1993  Arthur ......................... 427/245
6,268,614 B1     7/2001  Imai
6,376,857 B1     4/2002  Imai
2001/0025933 A1* 10/2001  Imai ........................... 250/580
2001/0025938 A1  10/2001  Imai

FOREIGN PATENT DOCUMENTS

JP    2000-105297    4/2000
JP    2001-264442    9/2001
JP    2001-337171   12/2001

* cited by examiner

*Primary Examiner*—David Porta
*Assistant Examiner*—Shun Lee
(74) *Attorney, Agent, or Firm*—Sughrue Mion, PLLC

(57) ABSTRACT

An image recording medium includes a first electrode layer permeable to a recording electromagnetic wave carrying thereon image information, and a recording photoconductive layer which contains a-Se as a major component and becomes conductive upon exposure to the recording electromagnetic wave which are superposed one on another in this order with an inhibition layer for inhibiting interfacial crystallization of the recording photoconductive layer intervening between the first electrode layer and the recording photoconductive layer. The inhibition layer is formed by coating the surface of the recording photoconductive layer with organic polymer by the use of low boiling point solvent.

8 Claims, 2 Drawing Sheets

IMAGE RECORDING MEDIUM AND METHOD OF PRODUCING THE SAME

BACKGROUND OF THE INVENTION

1. Field of the Invention

This invention relates to an image recording medium which stores electric charges generated in a recording photoconductive layer upon exposure to recording electromagnetic waves carrying image information and a method of producing the same.

2. Description of the Related Art

As an image recording medium having a charge storing portion which stores electric charges, as latent image charges, generated upon exposure to recording electromagnetic waves carrying image information, there has been known a radiation image recording medium (electrostatic recording medium) comprising a photoconductive body such as a selenium plate sensitive to a radiation such as X-rays. The radiation image recording medium is used, for instance, in taking a diagnostic radiation image and is exposed to X-rays passing through an object. Upon exposure to X-rays carrying thereon radiation image information, each part of the radiation image recording medium stores an electric charge according to the amount of X-rays to which the part is exposed, whereby the radiation image recording medium stores, as an electrostatic latent radiation image, the radiation image information carried by the X-rays. The radiation image information can be read out from the radiation image recording medium by causing a laser beam or a line beam to scan the radiation image recording medium. See, for instance, U.S. Pat. No. 4,535,468. By the use of the radiation image recording medium, the irradiation dose to the patient can be reduced and at the same time, the diagnostic performance can be improved.

We, this applicant, have proposed, in U.S. Pat. Nos. 6,268,614 and 6,376,857, a radiation image recording medium which enables high response in reading and efficient takeout of the signal charge to be compatible with each other, a method of and an apparatus for recording a radiation image on the radiation image recording medium, and a method of and an apparatus for reading out a radiation image from the radiation image recording medium.

In the method of recording and reading out a radiation image disclosed in U.S. Pat. No. 6,268,614, a radiation image recording medium comprising a first electrode layer permeable to recording radiation or light generated by excitation by the recording radiation, a recording photoconductive layer which exhibits conductivity upon exposure to the recording radiation or the light generated by excitation by the recording radiation, a charge transfer layer which behaves like a substantially insulating material to a latent image charge and behaves like a substantially conductive material to a transfer charge in the polarity opposite to the latent image charge, a reading photoconductive layer which exhibits conductivity upon exposure to reading electromagnetic wave and a second electrode layer permeable to the reading light which are superposed one on another in this order is used, and the recording radiation is projected onto the first electrode layer of the radiation image recording medium so that electric charges are stored in a charge storing portion formed in an interface between the recording photoconductive layer and the charge transfer layer in an amount corresponding to the amount of the recording radiation projected onto the first electrode layer, whereby radiation image information is recorded on the radiation recording medium as an electrostatic latent image. Then the reading electromagnetic wave is projected onto the radiation image recording medium to read out the electrostatic latent image, whereby an image signal representing the radiation image information is obtained.

Further, we, this applicant, have proposed a radiation image recording medium in which the second electrode layer is in the form of a stripe electrode formed by a plurality of linear electrodes which are permeable to the reading electromagnetic wave and are arranged like stripes. In this radiation image recording medium, the electrostatic latent image can be intensively stored in the part of the charge storing portion corresponding to each of the linear electrodes of the stripe electrode and accordingly the sharpness of the image can be improved.

When radiation passing through an object is projected onto the first electrode layer of the radiation image recording medium with a DC voltage applied to the radiation image recording medium so that the first and second electrode layers respectively have negative and positive potentials, charged pairs are generated in the recording photoconductive layer in an amount corresponding to the amount of radiation passing through the first electrode layer, and negative charges are stored in the charge storing portion as latent image charges, whereby radiation image information is recorded on the radiation image recording medium as an electrostatic latent image.

When the reading electromagnetic wave is projected onto the second electrode layer of the radiation image recording medium after application of the DC voltage is stopped and the first and second electrode layers are short-circuited to relocate the charges, the reading electromagnetic wave passes through the second electrode layer and impinges upon the reading photoconductive layer to generate charged pairs in the reading photoconductive layer. The positive charges of the charged pairs passes through the charge transfer layer and combine with the negative charges stored in the charge storing portion whereas the negative charges recombine with the positive charge in the second electrode layer, whereby electrical discharges occur. By detecting change of voltage between the first and second electrode layers generated by the electrical discharges as electric current change by a current amplifier or the like, the electrostatic latent image is read.

The aforesaid recording photoconductive layer is often formed of a-Se (amorphous selenium) in that a-Se is high in dark resistance and excellent in response speed. However, the recording photoconductive layer of a-Se is disadvantageous in that in the case where a first electrode layer is formed on the surface of the recording photoconductive layer, interfacial crystallization of amorphous selenium progresses at the interface between the photoconductive layer and the first electrode layer due to contact with heat generated upon deposition of the electrode material and/or contact with the electrode material. Since the interfacial crystallization promotes charge injection from the first electrode layer upon recording of the radiation image information, which generates noise and deteriorates S/N. When transparent oxide film, especially ITO, is used as the material of the electrode layer, interfacial crystallization of amorphous selenium more significantly progresses at the interface between a-Se and the electrode material.

In order to avoid this problem, we, this applicant, have proposed to provide an inhibition layer of organic polymer for inhibiting interfacial crystallization between the first electrode layer and the recording photoconductive layer.

However, this approach is disadvantageous in that when the solvent for the organic polymer is high in boiling point, it becomes difficult to dry the polymer at normal temperatures without heating and the heating can cause interfacial crystallization at the recording photoconductive layer. Further, when the solvent for the organic polymer is large in water content, the water content can promote interfacial crystallization at the recording photoconductive layer. When the polymer is heated to remove the water content of the solvent, interfacial crystallization can be caused at the recording photoconductive layer for the same reason.

SUMMARY OF THE INVENTION

In view of the foregoing observations and description, the primary object of the present invention is to provide an image recording medium which has an inhibition layer for inhibiting interfacial crystallization of the recording photoconductive layer and in which interfacial crystallization of the recording photoconductive layer due to the inhibition layer is suppressed.

Another object of the present invention is to provide a method of producing such an image recording medium.

In accordance with a first aspect of the present invention, there is provided an image recording medium comprising a first electrode layer permeable to a recording electromagnetic wave carrying thereon image information, and a recording photoconductive layer which contains a-Se as a major component and becomes conductive upon exposure to the recording electromagnetic wave which are superposed one on another in this order with an inhibition layer for inhibiting interfacial crystallization of the recording photoconductive layer intervening between the first electrode layer and the recording photoconductive layer, and recording the image information carried by the recording electromagnetic wave by storing electric charges generated by the recording photoconductive layer upon exposure to the recording electromagnetic wave, wherein the improvement comprises that the inhibition layer is formed by coating the surface of the recording photoconductive layer with organic polymer by the use of low boiling point solvent.

The "recording electromagnetic wave" as used here means, for instance, radiation.

As the "organic polymer", small water content (water-insoluble) polymer such as polycarbonate, polystyrene, polymethyl methacrylate, polyvinyl acetate, and polyvinyl chloride may be used.

In accordance with a second aspect of the present invention, there is provided a method of producing an image recording medium comprising a first electrode layer permeable to a recording electromagnetic wave carrying thereon image information, and a recording photoconductive layer which contains a-Se as a major component and becomes conductive upon exposure to the recording electromagnetic wave which are superposed one on another in this order with an inhibition layer for inhibiting interfacial crystallization of the recording photoconductive layer intervening between the first electrode layer and the recording photoconductive layer, and recording the image information carried by the recording electromagnetic wave by storing electric charges generated by the recording photoconductive layer upon exposure to the recording electromagnetic wave, wherein the improvement comprises that the inhibition layer is formed by coating the surface of the recording photoconductive layer with organic polymer by the use of low boiling point solvent.

"coating the surface of the recording photoconductive layer with organic polymer" may be effected, for instance, by dipping, spraying, bar-coating or screen-coating. Especially dipping is suitable for producing a large size image recording medium since an inhibition layer can be formed by simply repeating dipping the recording photoconductive layer in a polymer solution and taking out the same.

It is preferred that the low boiling point solvent be not higher than 65° C. in boiling point.

The solvent may be, for instance, chlorinated hydrocarbons or fluorides.

The chlorinated hydrocarbons include, for instance, methylene chloride, chloroform, 1,1-dichloroethane, and 1,2-dichloroethylene.

The fluorides include, for instance, 1,1-dichloro-1-fluoroethane, and 1,1,2-trichlorotrifluoroethane.

In accordance with the present invention, since the inhibition layer is formed by coating the surface of the recording photoconductive layer with organic polymer by the use of low boiling point solvent, production of the inhibition layer does not require a heating process, interfacial crystallization of the recording photoconductive layer can be avoided and deterioration in S/N of the image information caused by interfacial crystallization of the recording photoconductive layer can be avoided.

When the low boiling point solvent is not higher than 65° C. in boiling point, the inhibition layer can be dried at normal temperatures.

Further, when the solvent is chlorinated hydrocarbons or fluorides, which are less apt to contain water, interfacial crystallization of the recording photoconductive layer caused by water content of the inhibition layer can be suppressed.

DESCRIPTION OF THE PREFERRED EMBODIMENTS

Figure 1A:
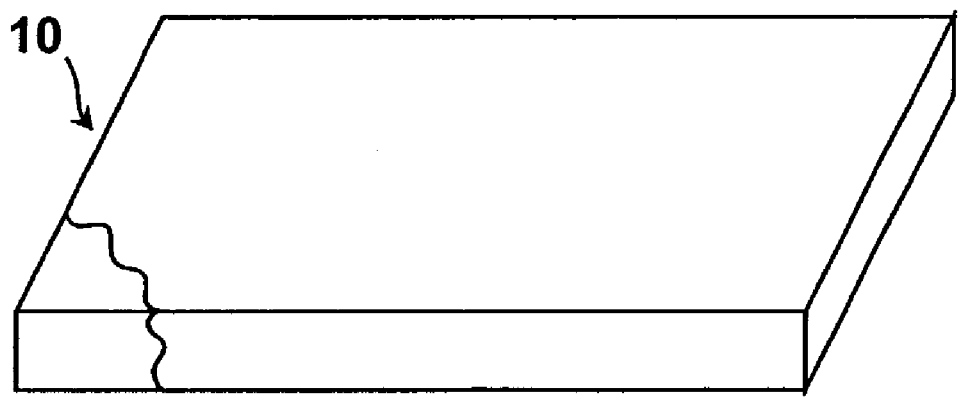
FIG. 1A is a perspective view showing a image recording medium in accordance with an embodiment of the present invention.
Figure 1B:
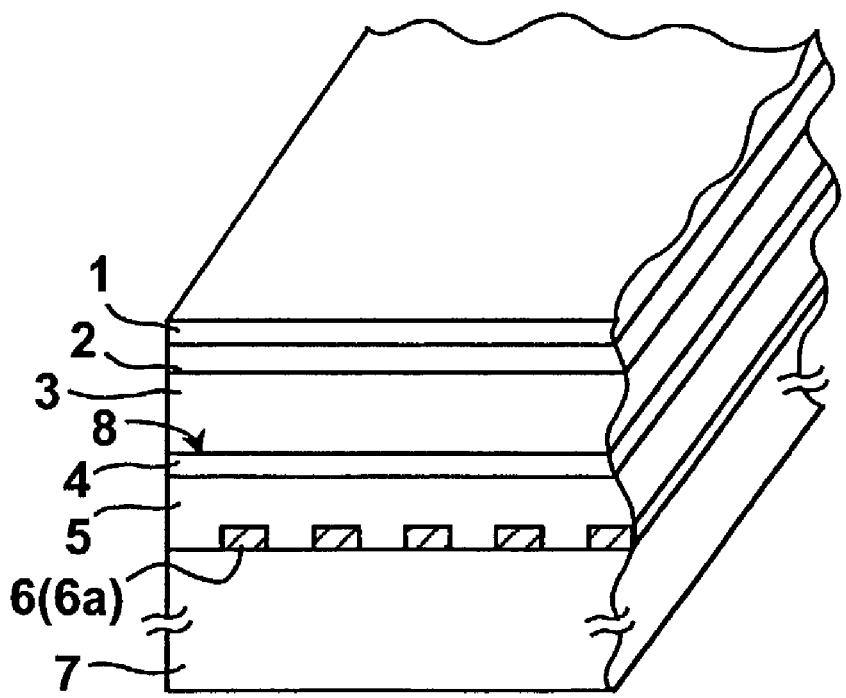
FIG. 1B is a fragmentary cross-sectional view showing a part of the image recording medium.

In FIGS. 1A and 1B, an electrostatic image recording medium 10 in accordance with an embodiment of the present invention comprises a first electrode layer 1 permeable to recording light (e.g., X-rays), an inhibition layer 2 which inhibits interfacial crystallization of a recording photoconductive layer 3 (to be described later) at the interface between the first electrode layer 1 and the recording photoconductive layer, the recording photoconductive layer 3 which exhibits conductivity upon exposure to the recording radiation passing through the first electrode layer 1 and the inhibition layer 2, a charge transfer layer 4 which behaves like a substantially insulating material to an electric charge in which the first electrode layer 1 is charged (a latent image charge) and behaves like a substantially conductive material to a charge in the polarity opposite to the latent image charge, a reading photoconductive layer 5 which exhibits conductivity upon exposure to reading light and a second electrode layer 6 permeable to the reading light which are superposed one on another in this order from the second electrode layer 6 on a substrate 7 permeable to the reading light. A charge storing portion 8 which stores the latent image charge generated in the recording photoconductive layer 3 is formed at the interface between the recording photoconductive layer 3 and the charge transfer layer 4.

The substrate 7 should be formed of a material which is transparent to the reading light, and at the same time, is deformable with change in ambient temperature. The coefficient of thermal expansion of the substrate 7 should be in the range of several fractions to several times of that of the reading photoconductive layer 5 and is preferably relatively close to that of the reading photoconductive layer 5.

The first and second electrode layers 1 and 6 may only have to be transparent respectively to the recording light and the reading light, and may be, for instance, 50 to 200 nm thick nesa film ($SnO_2$), ITO (Indium Tin Oxide) film or IDIOX (Idemitsu Indium X-metal Oxide) film (which is light-transmissive amorphous oxide film commercially available from Idemitsu Kosan). When X-rays are used as the recording light, the first electrode 1 need not be permeable to visible light and accordingly may be 100 nm thick Al film or Au film.

The second electrode layer 6 is a stripe electrode formed by arranging a number of elements (linear electrode elements) 6a at pitches of pixels. In this particular embodiment, no insulating material is disposed between the elements 6a and the second electrode layer 6 is solely formed by the elements 6a. However, insulating material may be disposed between the elements 6a.

The first electrode layer 1 may be also a stripe electrode.

Though may be of any material so long as it becomes conductive upon exposure to the recording light, the recording photoconductive layer 3 should contain as a major component a-Se which is relatively high in quantum efficiency to radiation and high in dark resistance.

As the material of the charge transfer layer 4, the larger the difference between the mobility of the negative charge in which the first electrode layer 1 is charged and the mobility of the positive charge (e.g., not smaller than $10^2$ and preferably not smaller than $10^3$), the better, and, for instance, organic compounds such as poly-N-vinyl carbazole (PVK), N,N'-diphenyl-N,N'-bis(3-methylphenyl-[1,1'-biphenyl]-4,4'-diamine (TPD) and discotheque liquid crystal, polymer (polycarbonate, polystyrene, PUK) dispersions of TPD, and semiconductor materials such as a-Se doped with 10 to 200 ppm Cl are suitable.

The reading photoconductive layer 5 may be of any material so long as it becomes conductive upon exposure to the reading light, and photoconductive materials containing therein as a major component at least one of a-Se, Se—Te, Se—As—Te, metal-free phthalocyanine, metallic phthalocyanine, MgPc (magnesium phthalocyanine), VoPc (phase II of Vanadyl phthalocyanine) and CuPc (copper phthalocyanine) may be suitably used.

When producing the electrostatic image recording medium 10, the second electrode layer 6 is first formed on the substrate 7 and the reading photoconductive layer 5, the charge transfer layer 4, the recording photoconductive layer 3, the inhibition layer 2 and the first electrode layer 1 are formed on the second electrode layer 6 in sequence. The first electrode layer 1 is formed by deposition. Interfacial crystallization can occur in the recording photoconductive layer 3 containing therein a-Se as a major component, when it is exposed to heat for deposition or brought into contact with the first electrode layer. The interfacial crystallization promotes charge injection from the first electrode layer 1 to deteriorate S/N. The inhibition layer 2 is for inhibiting the interfacial crystallization.

However, when the inhibition layer 2 is formed by resistance heating deposition of inorganic material or when the inhibition layer 2 is formed of inorganic material and is brought into contact with the recording photoconductive layer 3, interfacial crystallization can also occur in the recording photoconductive layer 3.

In this embodiment, the inhibition layer 2 is formed of organic polymer such as polycarbonate by coating. The organic polymer which can be employed as the material of the inhibition layer 2 includes, in addition to polycarbonate, small water content (water-insoluble) polymer such as polystyrene, polymethyl methacrylate, polyvinyl acetate, and polyvinyl chloride.

If the organic polymer is coated by the use of high boiling-point solvent, the polymer must be dried under elevated temperature and interfacial crystallization can be caused in the recording photoconductive layer 3 by the elevated temperature. Accordingly, in this embodiment, low boiling-point (not higher than 65° C.) solvent is used and the polymer is dried at room temperatures. Further, when the solvent contains a large amount of water, interfacial crystallization can be caused by water contained in the inhibition layer 2. Accordingly, in this embodiment, solvent less apt to contain water is employed. As solvent which is low in boiling point and less apt to contain water, for instance, methylene chloride may be employed. Other chlorinated hydrocarbons and fluorides such as chloroform, 1,1-dichloroethane, and 1,2-dichloroethylene, 1,1-dichloro-1-fluoroethane, and 1,1,2-trichlorotrifluoroethane may be employed.

The organic polymer may be coated by dipping, spraying, bar-coating or screen-coating.

Figure 2:
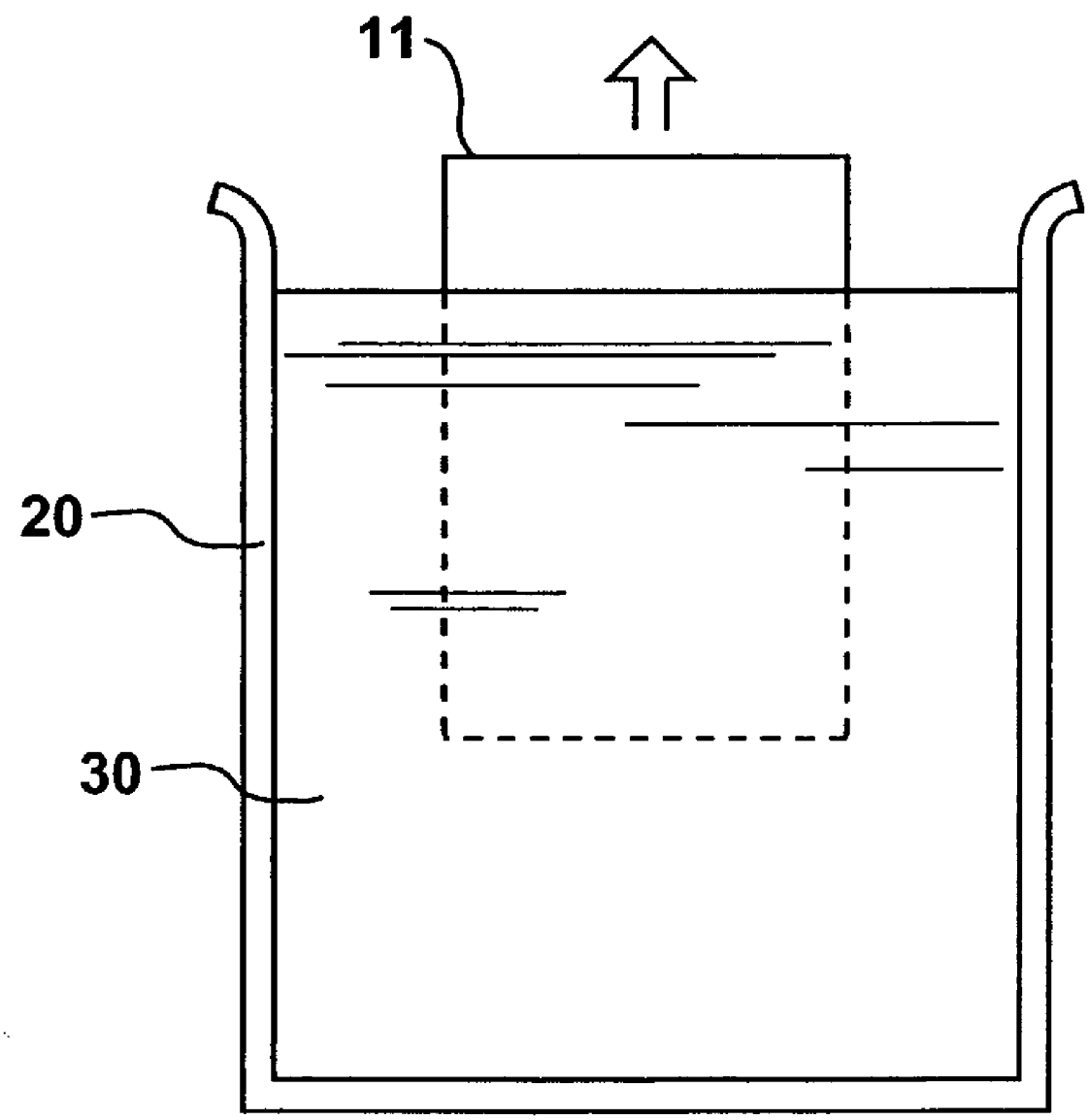
FIG. 2 is a view for illustrating production of the inhibition layer of the image recording medium shown in FIG. 1A.

FIG. 2 is a view for illustrating in brief the dipping. As shown in FIG. 2, a reservoir 20 is filled with a material solution 30 comprising polycarbonate dissolved in methylene chloride solvent. Then a member 11 comprising a substrate 7, a second electrode layer 6, a reading photoconductive layer 5, a charge transfer layer 4 and a recording photoconductive layer 3 are superposed one on another in this order is dipped in the material solution and taken out. This method is advantageous in that even if the member 11 or the electrostatic image recording medium 10 to be produced, is large in size, the inhibition layer 2 can be formed by simply using a larger reservoir and at the same time the thickness of the inhibition layer 2 can be controlled by controlling the number of times by which the member 11 is dipped in the material solution 30.

In the embodiment described above, the inhibition layer 2 is formed by coating the surface of the recording photoconductive layer 3 with polycarbonate by the use of methylene chloride solvent which is low in boiling point and accordingly, the recording photoconductive layer 3 is not exposed to a high temperature during production of the image recording medium 10, whereby interfacial crystallization of the recording photoconductive layer 3 can be avoided and deterioration in S/N due to interfacial crystallization of the recording photoconductive layer 3 can be avoided.

By doping the interface between the inhibition layer 2 and the recording photoconductive layer 3 with As or Cl in the embodiment described above, interfacial crystallization can be further suppressed.

A similar inhibition layer may be provided between the reading photoconductive layer 5 and the second electrode layer 6. At this time, by coating the organic polymer in the longitudinal direction of the elements 6a, an inhibition layer uniform in thickness can be obtained. Further, the interface between the reading photoconductive layer 5 and the second electrode layer 6 may be doped with As or Cl.

What is claimed is:

1. A method of producing an image recording medium comprising a first electrode layer permeable to a recording electromagnetic wave carrying thereon image information, and a recording photoconductive layer which contains a-Se as a major component and becomes conductive upon exposure to the recording electromagnetic wave which are superposed one on another in this order with an inhibition layer for inhibiting interfacial crystallization of the recording photoconductive layer intervening between the first electrode layer and the recording photoconductive layer, and recording the image information carried by the recording electromagnetic wave by storing electric charges generated by the recording photoconductive layer upon exposure to the recording electromagnetic wave, wherein the improvement comprises that the inhibition layer is formed by coating the surface of the recording photoconductive layer with an organic polymer in a low boiling point solvent and drying the coating at room temperature.

2. A method as defined in claim 1 in which the organic polymer is a small water content polymer.

3. A method as defined in claim 2, wherein the small water content polymer is selected from the group consisting of polycarbonate, polystyrene, polymethyl methacrylate, polyvinyl acetate and polyvinyl chloride.

4. A method as defined in claim 3, wherein the small water content polymer is polycarbonate.

5. A method as defined in claim 1 in which the low boiling point solvent is not higher than 65° C. in boiling point.

6. A method as defined in claim 5 in which the low boiling point solvent is a chlorinated hydrocarbon or a fluoride.

7. A method as defined in claim 6, wherein the chlorinated hydrocarbon is selected from the group consisting of methylene chloride, chloroform, 1,1-dichloroethane and 1,2-dichloroethylene.

8. A method as defined in claim 6, wherein the fluoride is selected from the group consisting of 1,1-dichloro-1-fluoroethane and 1,1,2-trichlorotrifluoroethane.

* * * * *